United States Patent [19]

Flannagan et al.

[11] Patent Number: 4,807,198
[45] Date of Patent: Feb. 21, 1989

[54] MEMORY INPUT BUFFER WITH HYSTERESIS AND DC MARGIN

[75] Inventors: Stephen T. Flannagan, Austin, Tex.; Peter H. Voss, Eersel, Netherlands

[73] Assignee: Motorola, Inc., Schaumburg, Ill.

[21] Appl. No.: 138,103

[22] Filed: Dec. 28, 1987

[51] Int. Cl.[4] .................. G11C 11/40; G11C 13/00
[52] U.S. Cl. .................. 365/230; 365/189; 365/190
[58] Field of Search ............ 365/182, 189, 190, 202, 365/203, 206, 230

[56] References Cited

U.S. PATENT DOCUMENTS

4,769,789  9/1988  Noguchi et al. .................. 365/189

Primary Examiner—Terrell W. Fears
Attorney, Agent, or Firm—James L. Clingan, Jr.

[57] ABSTRACT

A memory has input buffer circuit which provides high immunity to problems associated with address float while providing high speed for both decoder selection and for transition detection. The input buffer circuit includes a pair of input NOR gates which provides for independent signal paths to a cross-coupled latch. Independent hysteresis circuits are provided to each signal path between the two NOR gates and the cross-coupled latch. This allows for independently selecting the amount of dc margin and hysteresis so that the use of hysteresis does not adversely effect dc margin.

12 Claims, 4 Drawing Sheets

MEMORY INPUT BUFFER WITH HYSTERESIS AND DC MARGIN

FIELD OF THE INVENTION

The present invention relates to input buffers, and more particularly, to memory input buffers with hysteresis which are particularly useful as address buffers.

BACKGROUND OF THE INVENTION

In memories input buffers are required for address signals, data signals, and control signals such as a chip enable signal or a write enable signal. In these applications it is generally desirable for the input buffer to have high speed and low power. More subtle considerations include noise immunity and address float. Address float occurs when the input address is allowed to be simply high impedance so that the input voltage is not driven to any particular state but is allowed to "float." Although particularly common for addresses, this can be true for other signals as well. Outputs of microprocessors which provide the address signals are commonly tri-stated between active cycles. It is desirable that the input buffer not cause problems internal to the memory in this type of case. One thing that is desired is for the memory to not respond to a floating address as numerous transitions. In many memories, particularly static random access memories (SRAMs), the memory is designed to respond to address transitions. In such a memory most of the power consumption is in response to an address transition. Accordingly, it is desirable that during address float, which may result in any D.C. input voltage, that the address buffer not oscillate back and forth between two logic states. Additionally, for slow address transitions there may be a small amplitude, high frequency signal superimposed on the slow moving input signal. In such case there can be a response back and forth to the high frequency signal then the input signal is near the switch point of the input buffer. These problems have been addressed by providing hysteresis to change the switch point after the switch point has been initially reached. Although hysteresis has been useful in dealing with the problems of a floating or slow moving input, adding hysteresis has also resulted in reduced speed and/or increased circuit complexity with the consequent chip area penalty. Another problem with address float and the accompanying D.C. voltage level which can foreseeably be anywhere between the power supply voltages (voltages outside the power supply voltages present problems more associated with input protection than signal interpretation), is that the address may be interpreted as being a logic high for some portions of the internal circuit while interpreted as a logic low for some other portions. This can have the undesirable result of selecting two decoders which are intended to be exclusive of each other. Another criterion, for typical SRAM applications, is that the address buffer must be able to conveniently provide signals needed for address transition detection.

SUMMARY OF THE INVENTION

An object of the present invention is to provide an improved input buffer.

Another object of the invention is to provide an input buffer with improved dc margin.

Yet another object of the invention is to provide an input buffer with improved response to a floating input.

These and other objects are achieved in an input buffer circuit for providing true and complementary signals in response to an input signal switching between first and second voltages. The input buffer circuit has a first buffer, a second buffer, a cross-coupled latch, a first hysteresis circuit, and a second hysteresis circuit. The first buffer has an input for receiving the input signal and, an output for providing a first intermediate signal responsive thereto. The second buffer has an input for receiving the input signal and, an output for providing a second intermediate signal responsive thereto. The crosscoupled latch has an inverting input coupled to the output of the first buffer, a non-inverting input coupled to the output of the second buffer, a first output for providing the true signal, and a second output for providing the complementary signal. The first hysteresis circuit, which is coupled to the output of the first buffer, causes the first buffer to provide the first intermediate signal at a voltage which, for a first predetermined range of voltage of the input signal between the first and second voltages, is different for a transition of the input signal from the first voltage to the second voltage than for a transition of the input signal from the second voltage to the first voltage. The second hysteresis circuit, which is coupled to the output of the second buffer, causes the second buffer to provide the second intermediate signal at a voltage which, for a second predetermined range of voltage of the input signal between the first and second voltages, is different for a transition of the input signal from the first voltage to the second voltage than for a transition of the input signal from the second voltage to the first voltage.

DESCRIPTION OF THE INVENTION

Figure 1:
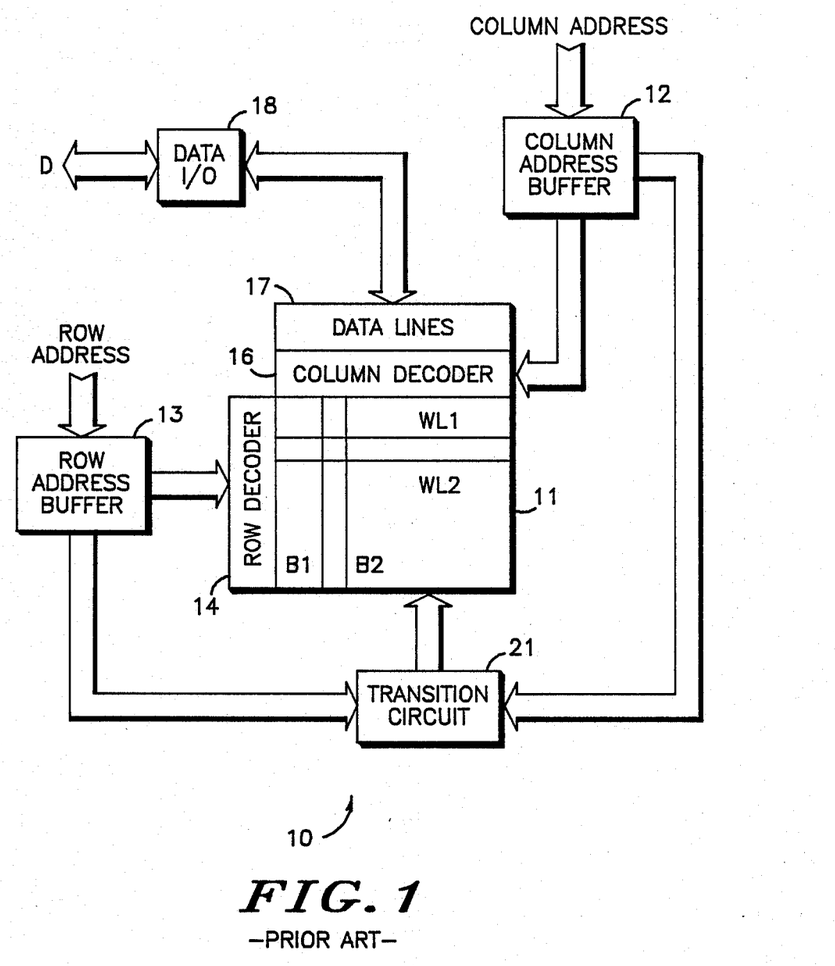
FIG. 1 is a block diagram of a memory according to the prior art.

Prior to describing the invention itself, prior art is described which is believed to be helpful in understanding the invention. Shown in FIG. 1 is a static random access memory (SRAM) 10 comprised generally of an array of SRAM cells 11; a column address buffer 12 having an input for receiving a column address, a first output, and a second output; a row address buffer 13 having an input for receiving a row address, a first output, and a second output; a row decoder 14 coupled to the first output of the row address buffer and to array 11; a column decoder 16 coupled to the first output of column address buffer 12 and to array 11; a data I/0 circuit 18 coupled to data lines 17 for receiving data D from external pins (not shown) in a write mode and providing data D to the external pins in a read mode; and a transition circuit 21 having a first input coupled to the second output of row address buffer 13, a second input coupled to the second output of column address buffer 12, and a plurality of outputs for providing various signals responsive to an address transition. Array 11 has memory cells located at intersections of word lines and bit line pairs as is conventional for a SRAM. Memory 10 is organized in a x1 configuration so that a single bit of data is provided as data D, but memory 10 could also be organized in some other conventional configuration, such as x4 or x8. Shown in array 11 are word lines WL1 and WL2 and bit line pairs B1 and B2. Row decoder 14 decodes the row address received via buffer 13 to enable a word line selected by the row address. Column decoder 16 decodes the column address received via buffer 12 to couple a bit line pair selected by the column address to data lines 17. If memory 10 is in the write mode, data D is input to the selected bit line pair via data I/0 18 and data lines 17. If memory 10 is in the read mode, data D is output from the selected bit line pair via data lines 17 and data I/O 18.

Figure 2:
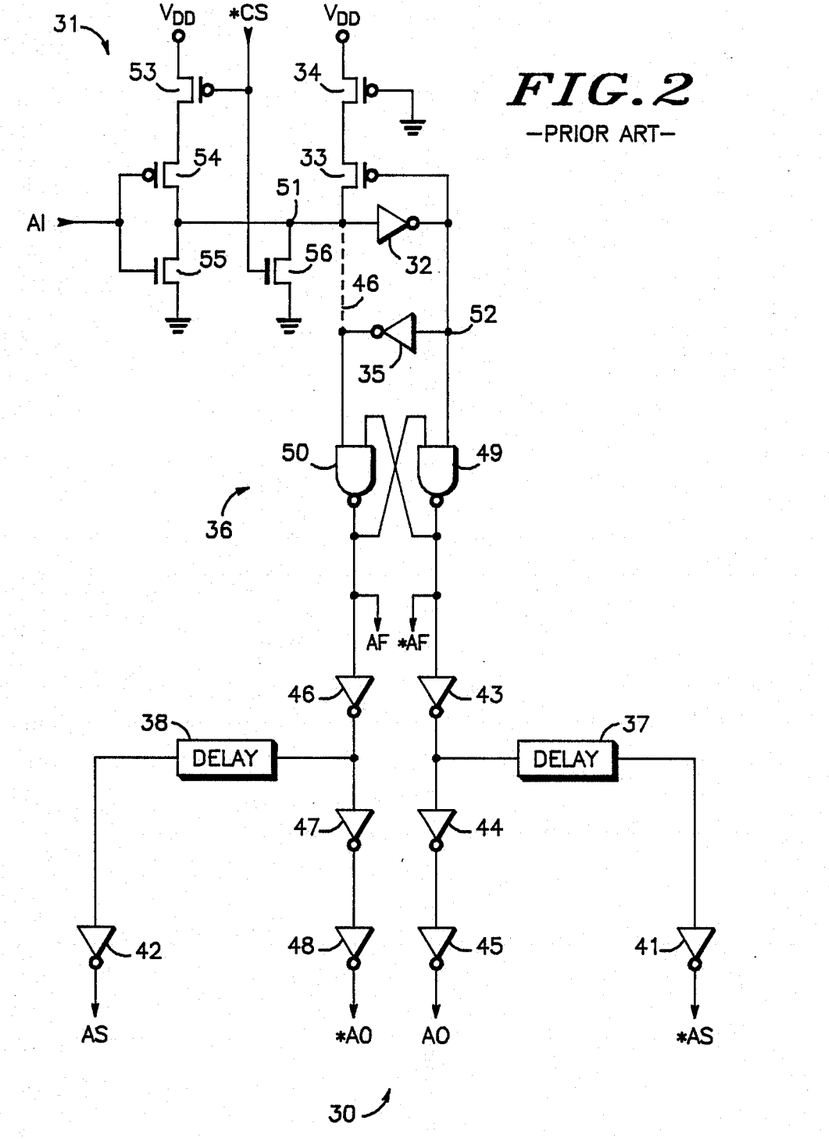
FIG. 2 is a combination logic and circuit diagram of an address buffer or the prior art for use in the memory of FIG. 1.

Shown in FIG. 2 is an address buffer circuit 30 exemplary of those which have been used to comprise row address buffer 13 and column address buffer 12 and which satisfies may of the desirable features of an address buffer. Row address buffer 13 and column address buffer 12 are each comprised of a plurality of buffer circuits like buffer circuit 30. Buffer circuit 30 comprises generally a NOR gate 31, an inverter 32, a P channel transistor 33, a P channel transistor 34, an inverter 35, a cross-coupled latch 36, a delay circuit 37, a delay circuit 38 and inverters 41, 42, 43, 44, 45, 46, 47, and 48. Cross-coupled latch 36 is comprised of a NAND gate 49 and a NAND gate 50. NOR gate 31 comprises a P channel transistor 53, a P channel transistor 54, an N channel transistor 55, and an N channel transistor 56. Transistor 54 has a gate for receiving an externally provided address input signal AI, a drain connected to a node 51, and a source. Transistor 53 has a source connected to VDD, a gate for receiving a chip select signal *CS, and a drain connected to the source of transistor 54. Transistor 55 has gate for receiving signal AI, a source connected to ground and a drain connected to node 51. Transistor 56 has a gate for receiving signal *CS, a source connected to ground, and a drain connected to node 51. The gates of transistors 53 and 56 form a first input of NOR gate 31, the gates of transistors 54 and 55 form a second input of NOR gate 31, and node 51 is an output of NOR gate 31.

Inverter 32 has an input connected to node 51, and an output connected to a node 52. Transistor 34 has a source connected to VDD, a gate connected to ground, and a drain. Transistor 33 has a gate connected to the output of inverter 32, a source connected to the drain of transistor 34, and a drain connected to node 51. Inverter 35 has an input connected to node 52, and an output. NAND gate 49 has a first input connected to node 52, an output for providing a complementary fast address signal *AF, and a second input. NAND gate 50 has a first input connected to the output of inverter 35, an output connected to the second input of NAND gate 49 for providing a true fast address signal AF, and a second input connected to the output of NAND gate 50. Inverter 43 has an input connected to the output of NAND gate 49, and an output. Inverter 44 has an input connected to the output of inverter 43, and an output. Inverter 45 has an input connected to the output of inverter 44, and an output for providing buffer circuit true output signal AO. Inverter 46 has an input connected to the output of NAND gate 50, and an output. Inverter 47 has an input connected to the output of inverter 46, and an output. Inverter 48 has an input connected to the output of inverter 47, and an output for providing buffer circuit complementary output signal *AO. Delay circuit 37 has an input connected to the output of inverter 43, and an output. Inverter 41 has an input connected to the output of delay circuit 37, and an output for providing a complementary slow address signal *AS. Delay circuit 38 has an input connected to the output of inverter 46, and an output. Inverter 42 has an input connected to the output of delay circuit 38, and an output for providing a true slow address signal AS.

When memory 10 is deselected, signal *CS is a logic high so that transistor 56 is conducting and transistor 53 is not. This causes node 51 to be held to a logic low regardless of the state of signal AI. When signal *CS is a logic low transistor 53 is conductive and transistor 56 is not so that node 51 is responsive to signal AI. This is conventional NOR gate usage for an input buffer. The condition of interest is when signal *CS is a logic low so that buffer 30 is responsive to signal AI. With signal *CS at a logic low, NOR gate 31 is effectively an inverter with an output responsive to signal AI. NOR gate 31 can also be viewed as a clocked inverter which is enabled when signal *CS is active, indicating that memory 10 is selected. Although a NOR gate is generally considered desirable, a NAND gate could also be used for enabling buffer 30 to be responsive to signal AI under the control of some signal such as a chip select signal.

When signal AI is a logic low, transistors 54 and 55, operating as an inverter, cause node 81 to be a logic high. With node 51 at logic high, inverter 32 makes node 52 a logic low. Node 52 at logic low causes transistor 33 to be conductive, NAND gate 49 to output a logic high, and inverter 35 to output a logic high. Transistor 34 is always conductive. With the outputs of NAND gate 49 and inverter 35 at logic high, NAND gate 50 provides a logic low output. Signal AF is a logic low, and signal *AF is a logic high. Sequentially connected inverters 43-45 comprise an output driver which provides signal AO at the logic state complementary to that of the output of NAND gate 49 so that signal AO is a logic low. Similarly, sequentially connected inverters 46-48 comprise an output driver which provides signal *AO at the logic state complementary to that of the output of NAND gate 50 so that signal *AO is a logic high.

There are two inversion stages between NAND gate 49 and the output of inverter 41 so that signal *AS is provided at the same logic state as that provided on the output of NAND gate 49. Although there is a time delay caused by inverters 43 and 41 and delay circuit 37 between a change in the output of NAND gate 49 and the output of inverter 41 responding to that change, the steady state conditions of the outputs of NAND gate 49 and inverter 41 ar the same. Signal *AS is thus a logic high. Similarly, there are two inversion stages between NAND gate 50 and the output of inverter 42 so that signal AS is provided at the same logic state as that provided on the output of NAND gate 50. Although there is a time delay caused by inverters 46 and 42 and delay circuit 38 between a change in the output of NAND gate 50 and the output of inverter 42 responding to that change, the steady state conditions of the outputs of NAND gate 50 and inverter 42 are the same. Signal AS is thus a logic low. Signals AF, AS, and AO correspond to the logic state of input signal AI by being the same logic state. Signals *AF, *AS, and *AO correspond to the logic state of input signal AI by being complementary thereto.

Transistor 33 reinforces the logic condition present on node 51 which is significant as signal AI approaches the switch point of the input, the first input, of NOR gate 31 which receives signal AI. The switch point of a circuit as related to an inverter is the voltage at which the input voltage is the same as the output voltage. For inverting logic gates, which can be considered types of inverters in many applications, there is more than one input. The logic gate can be designed so that different inputs can have different switch points. The switch point of the first input of NOR gate 31 is determined primarily by the gains of transistors 53, 54, and 55. The gain of transistor 53 is made significantly larger than the gain of transistor 54 so that the ratio of the gains of transistors 54 and 55 is the most significant determinant of switch point and the effect of transistor 53 is relatively minor. For active operation in which signal *CS is a logic low, NOR gate 31 operates essentially as an inverter comprised of transistors 54 and 55. The gain of transistor 55 is sufficiently greater than that of transistor 54 to establish a switch point at about 1.4 volts for the case in which VDD is 5.0 volts. Transistors 33 and 34 also affect the switch point.

When transistor 33 is conductive, the switch point of the transistor 54-55 inverter is increased because of the additional current required to flow through transistor 55 as it becomes conductive. As signal AI increases from a logic low at or near ground potential in which transistor 55 is non-conductive, transistor 55 becomes conductive when its threshold voltage is exceeded. As signal AI increases toward a logic high, transistor 55 becomes more conductive as its gate to source voltage increases. This tends to cause node 51 to drop in voltage toward becoming a logic low. Transistor 33 being conductive retards the rate at which transistor 55 can reduce the voltage on node 51. The presence of transistor 33 has the effect of increasing the switch point for the case in which signal AI is switching from a logic low to a logic high. The magnitude of the affect on the switch point of the transistor 54-55 inverter is determined by the conductivity of the current path between VDD and node 51. This conductivity in turn is related to the gains of transistors 33 and 34.

The gain of transistor 33 could be selected to provide the desired change in switch point. The change in switch point is less when node 51 is switching from a logic low to a logic high because transistor 33 is not conductive when node 51 begins at logic low because inverter 32 responds to node 51 being a logic low by providing a logic high output to the gate of transistor 33. While transistor 33 is non-conductive, it does not operate to raise the current provided to node 51 beyond that provided through transistor 54. Consequently, the switch point is higher for the case in which signal AI is switching from a logic low to a logic high than from a logic high to a logic low. This difference between switch points, dependent upon the direction of the input signal, is commonly known as hysteresis. The hysteresis provides a margin of safety in avoiding the voltage on node 51 changing direction for a very small change in direction on the input near the switch point. Transistor 34 is added as a load device to allow the hysteresis to be optimized without adding speed-reducing capacitance to node 52 beyond the capacitance of a minimum gate area transistor.

As the voltage on node 51 drops in response to input signal AI increasing from a logic low toward a logic high, inverter 32 responds by increasing the voltage on node 52. The switch point of inverter 35 is intentionally chosen to be lower than the switch point of the first input of NAND gate 49, the input connected to node 52. Consequently, inverter 35 provides a logic low to the first input of NAND gate 50 before node 52 is recognized as a logic high by the first input of NAND gate 49. A logic low on any input of a NAND gate forces the NAND gate to provide a logic high output. There is thus a voltage range on node 52 defined by the difference in switch points of inverter 35 and the first input of NAND gate 49 over which both NAND gates 49 and 50 will provide a logic high output.

As the voltage on node 52 continues to increase, the first input of NAND gate 49 will respond to the voltage on node 52 as a logic high. With inverter 35 having already provided a logic low to the first input of NAND gate 50, NAND gate 50 has output a logic high to the second input of NAND gate 49 so that upon node 52 reaching a logic high, *AND gate 49 provides a logic low output. Signal AF thus switches from a logic low to a logic high sooner than signal *AF switches from a logic high to a logic low. A delay period, defined by the propagation delays of inverters 43 and 41 and the time delay of delay circuit 37, following signal *AF switching from a logic high to a logic low, signal *AS switches from a logic high to a logic low. Similarly, a delay period, defined by the propagation delays of inverters 46 and 42 and the time delay of delay circuit 38, following signal AF switching from a logic low to a logic high, signal AS switches from a logic low to a logic high.

Signals AF, AS, *AF, and *AS are received by transition circuit 21. The time delay between the transition of the fast address signals AF and *AF and the slow address signals AS and *AS is used to generate a transition pulse. For a given transistor size, the transition which can be detected most rapidly is the logic low to logic high transition because N channel transistors have a higher mobility than P channel transistors. In circuit 30, the logic low to logic high transition occurs first to take advantage of the superior logic low to logic high transition detection characteristic. In the conventional transition detection circuit, as is used in transition circuits 31 and 32, the transition which initiates the generation of a transition pulse is the logic low to logic high transition on either of the fast signals AF or *AF. The logic high to logic low transition of the corresponding slow signal, which is the slow signal having the opposite active logic state to that of the fast signal which initiated the transition pulse, terminates the transition pulse. For the logic low to logic high transition of signal AI, signal AF switches from a logic low to a logic high to initiate a transition pulse. The logic low to logic high transition occurs first in circuit 60 so that the transition pulse is initiated on the first transition. The logic low to logic high transition of signal AF occurs before the logic high to logic low transition of signal *AF. The transition pulse initiated by the logic low to logic high transition of signal AF is terminated by the logic high to logic low transition of signal *AS.

With input signal AI at logic high, node 51 is a logic low, node 52 is a logic high, transistor 33 is non-conductive, the output of inverter 35 is a logic low, signal AF is a logic high, signal *AF is a logic low, signal AO is logic high, signal *AO is a logic low, signal AS is a logic high, and signal *AS is a logic low. Signals AO and *AO are the address signals which are received by either row decoder 14 or column decoder 16, depending whether circuit 30 is a buffer circuit for row address buffer 13 or column address buffer 12, respectively. Row decoder 14 and column decoder 16 are both comprised of a plurality of decoder circuits. A particular decoder circuit within either row decoder 14 or column decoder 16 receives only one of signals AO and *AO as is conventional. When a received address signal is a logic low, the particular decoder circuit which receives that address signal is deselected. A decoder circuit is selected when all of the address signals received by it are a logic high as is typical for a CMOS decoder circuit. A typical CMOS decoder is implemented as a NAND gate. Circuit 30 is designed with the intention of preventing signals AO and *AO from being a logic high at the same time. The intent is for the outputs of NAND gates 49 and 40 to both be at a logic high for a certain voltage range of node 52 for either a logic low to logic high transition or logic high to logic low transition of input signal AI. Because there are 3 inversion stages between the outputs of NAND gates 49 and 50 and signals AO and *AO, when the outputs of NAND gates 49 and 50 are both a logic high, output signals AO and *AO are a logic low.

When signal AI begins switching from a logic high to a logic low, node 51 begins increasing in voltage but without the help of transistors 33 and 34 supplying current to node 51. After node 51 reaches a sufficiently high voltage, node 52 will be reduced in voltage sufficiently to cause transistor 33 to become conductive and thereby aid in raising the voltage on node 51. With transistor 33 supplying current to node 51, node 51 will be prevented from declining in voltage if there is a small increase in voltage of signal AI. This is the desired hysteresis which helps avoid oscillations on node 51, when signal AI is very slow moving.

Because the switch point of the first input of NAND gate 49 is greater than that of inverter 35, node 52 is interpreted as a logic low by NAND gate 49 at a voltage which is higher than the voltage at which inverter 35 interprets node 52 as a logic low. As the voltage on node 52 drops below the switch point of NAND gate 49, NAND gate 49 will begin providing a logic high output while inverter 35 will continue to provide a logic low output to NAND gate 50. In this condition between the switch points of inverter 35 and the first input of NAND gate 49, node 52 will cause the outputs of both NAND gates 49 and 50 be at a logic high. Because of the three inversion stages between fast signals AF and *AF and output signals AO and *AO, both signals AO and *AO are a logic low, the deselect state for both signals. Consequently, even for an address float condition in which node 52 is not in a clearly defined logic state, output signals AO and *AO can only be at the same logic state at a logic low, the deselect state. Another result, in the case in which both signals AF and *AF are a logic high, is that the transition pulse generated in response to the logic low to logic high transition remains active until one of signals AF and *AF switches to a logic low. With both signals AF and *AF at a logic high, both signals AS and *AS will also be a logic high. The transition pulse is not terminated until the slow signal opposite the polarity of the logic high fast signal switches to a logic low. This is desirable because this means that array 11 will remain equalized during this type of address float and will be ready for an access immediately upon a clear definition of the logic state of the input signal. This also reduces the possibility of any accidental loss of data in array 11.

As node 52 further decreases below the switch point of inverter 35, inverter 35 provides a logic high output which causes NAND gate 50 to provide a logic low output which in turn causes signal AS to switch to a logic low, thereby terminating the transition pulse which was initiated by the logic low to logic high transition of signal *AF. As a NAND gate, the output of NAND gate 50 cannot switch to a logic low until both of its inputs are a logic high. This is a desirable characteristic of cross-coupled latch 36. This characteristic aids in ensuring that both NAND gate outputs are not a logic low at the same time. For either a rapid or slow change of node 52 from a logic high to a logic low, the output NAND gate 50 cannot switch from a logic high to a logic low until the output of NAND gate 52 has switched to a logic high.

The propagation delay for a logic low to logic high transition of signal AF is that of 4 gates. The 4 gates are NOR gate 31, inverter 32, inverter 35, and NAND gate 50. The propagation delay for a logic low to logic high transition of signal *AF is that of 3 gates. The three gates are NOR gate 31, inverter 32, and NAND gate 49. The propagation delay in switching signal AF in response to a logic low to logic high transition of signal AI can be reduced by deleting inverter 35 and connecting the first input of NAND gate 50 to node 51 as shown by a dotted line 46 in FIG. 3. The logic low to logic high transition of signals *AF and AF is in the critical path of access time because the logic low to logic high transition initiates the transition pulse which in effect is the address transition detection. If the first input of NAND gate 50 is connected to node 51, then it is important that the switch point of inverter 32 be lower than the switch point of the first input of NAND gate 50 so as to provide a voltage range for node 51 in which both NAND gate outputs are a logic high. The reason for this is the same as has previously been explained with respect to inverter 35. A potential disadvantage is that the first input of NAND gate 50 receives a signal with 2 less stages of buffering.

Buffer 30 offers both high speed and high immunity to address float. Inverter 32 and transistors 33 and 34 are effective in adding hysteresis while reducing the speed penalty associated with the capacitance added to the output of inverter 32. A cross-coupled latch adds further margin in avoiding oscillating buffered address signals as well as avoiding simultaneous selection of mutually exclusive decoders. The logic low to logic high transition is the first to occur at the output of the cross-coupled latch which optimizes the speed of detection of a transition of the input signal. There is, however, a problem with dc margin which has not been appreciated. One aspect of the dc margin problem that has not been appreciated is that hysteresis can hurt dc margin. The dc margin is a voltage measurement relating the input voltage to the true and complementary signals.

The dc margin is a voltage range if an input signal over which both the true and complementary signal representations thereof are at the same logic state. In the present case the desired dc margin is for both signals AF and *AF to be at a logic high for some voltage range of signal AI. This dc margin is highly relevant for the address float condition in which signal AI can be slow moving and anywhere between Vdd and ground. Buffer 30 provides good dc margin for the logic low to logic high condition, but the action of transistor 33, which provides the desirable hysteresis, tends to remove the dc margin for the logic high to logic low transition of signal AI. For the logic low to logic high transition, node 51 is at a logic high, node 52 is at a logic low, and transistor 33 is conductive. As signal AI begins rising in voltage, node 51 begins dropping in voltage which causes node 52 to rise in voltage which in turn causes transistor 33 to be less conductive. Transistor 33 is an active part of the gain between signal AI and node 52. There is a range of voltage of signal AI over which the voltage at node 52 will result in both NAND gates 49 and 50 providing a logic high output. There is thus dc margin for the logic low to logic high transition which is related to the gain between signal AI and node 52 and to the range of voltage at node 52 over which NAND gates 49 and 50 will both provide a logic high output. For the logic high to logic low transition of signal AI, node 51 begins at a logic low, node 52 begins at a logic high, and transistor 33 begins in a non-conductive state. As signal AI begins dropping in voltage, node 51 begins rising in voltage, and node 52 begins dropping in voltage. At the onset of this logic state transition, the gain between signal AI and node 52 is less than the gain therebetween at the onset of the logic low to logic high transition because transistor 33 is non-conductive. Thus for a given drop in voltage of signal AI, there is less drop on node 52. When node 52 does drop sufficiently to cause transistor 33 to become conductive, there is an immediate rise in voltage on node 51 which causes node 52 to drop further which in turn causes transistor 33 to become more conductive. This establishes a positive feedback loop so that node 52 will drop some voltage at the onset of transistor 33 becoming conductive without any further change from signal AI. The drop in voltage on node 52 which occurs without any commensurate drop in voltage of signal Al, can drop the voltage below the voltage which will cause NAND gate 49 to recognize node 52 as a logic low. This would have the effect of reducing or even possibly eliminating the dc margin. This drop in voltage is directly related to the gain of transistor 33. The amount of hysteresis is also directly related to the gain of transistor 33. There is thus a tradeoff, which has not been recognized, between hysteresis and dc margin due to there being a voltage range on node 52 which is not stable in the range over which NAND gate 49 and inverter 35 differentiate between a logic high and a logic low for the case in which signal AI begins as a logic high.

Figure 3:
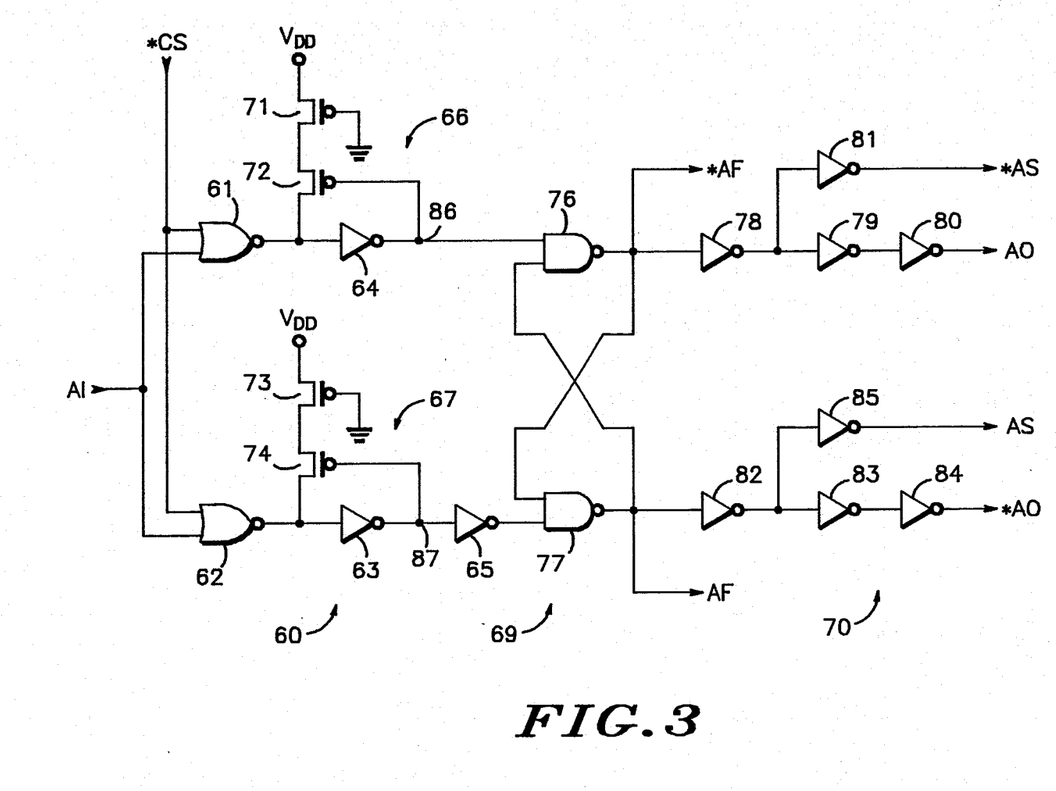
FIG. 3 is a combination logic and circuit diagram of an address buffer according to a first embodiment of the invention for use in the memory of FIG. 1.

Shown in FIG. 3 is a buffer 60, which provides for both optimized hysteresis and dc margin, comprised generally of a NOR gate 61, a NOR gate 62, an inverter 63, an inverter 64, an inverter 65, a hysteresis circuit 66, a hysteresis circuit 67, a cross-coupled latch 69, and a buffer stage 70. Hysteresis circuit 66 comprises a P channel transistor 71 and a P channel transistor 72. Hysteresis circuit 67 comprises a P channel transistor 73 and a P channel transistor 74. Cross-coupled latch 60 comprises a NAND gate 76 and a NAND gate 77. Buffer stage 70 comprises an inverter 78, an inverter 79, an inverter 80, an inverter 81, an inverter 82, an inverter 83, an inverter 84, and an inverter 85. NOR gate 61 has a first input for receiving signal *CS, a second input for receiving signal AI, and an output. NOR gate 62 has a first input for receiving signal *CS, a second input for receiving signal AI, and an output. NOR gates 61 and 62 are conventional NOR gates of the same configuration as that of NOR gate 31 in FIG. 2. Inverter 64 has an input connected to the output of NOR gate 61 and an output. Hysteresis circuit 66 has an input connected to a node 86 and an output connected to the input of inverter 64. Inverter 63 has an input connected to the output of NOR gate 62 and an output connected to a node 87. Hysteresis circuit 67 has an input connected to the output of inverter 63 and an output connected to the input of inverter 63. Inverter 65 has an input connected to the output of inverter 63 and an output. NAND gate 76 has a first input connected to node 86, an output for providing complementary fast signal *AF, and a second input. NAND gate 77 has a first input connected to the output of inverter 65, a second input connected to the output of NAND gate 76, and an output for providing true fast signal AF and connected to the second input of NAND gate 76. Viewing NAND gates 76 and 77 as cross-coupled latch 69, cross-coupled latch 69 has a first input connected to the output of inverter 86, a second input connected to the output of inverter 65, a first output for providing signal *AF, and a second input for providing signal AF. Inverter 78 has an input connected to the output of NAND gate 76, and an output. Inverter 79 has an input connected to the output of inverter 78, and an output. Inverter 80 has an input connected to the output of inverter 79, and an output for providing signal AO. Inverter 81 has an input connected to the output of inverter 78 and an output for providing signal *AS. Inverter 82 has an input connected to the output of NAND gate 77, and an output. Inverter 83 has an input connected to the output of inverter 82, and an output. Inverter 84 has an input connected to the output of inverter 83, and an output for providing signal *AO. Inverter 85 has an input connected to the output of inverter 82, and an output for providing signal AS. Viewing inverters 78–85 as output stage 70, output stage 70 has a first input connected to the output of NAND gate 76, a second input connected to the output of NAND gate 77, a first output for providing complementary slow signal *AS, a second output for providing buffered address signal AO, a third output for providing complementary buffered address signal *AO, and a fourth output for providing true slow signal AS.

NOR gates 61 and 62 provide an output responsive to signal AI when signal *CS is a logic low which is the case of interest. Buffer 60 provides independent control of hysteresis and dc margin for both the true and complementary signal path. Although the circuit structure between signal AI and node 86 is the same as that between signal AI and node 87, the amount of hysteresis and the switch points of the inverting devices are independently selectable. The path to node 87 and NAND gate 77 is selected to have a lower switch point than that to node 86 so that as signal AI is switching from a logic low to a logic high, node 87 will be at a higher voltage than that at node 86. When signal AI begins at a logic low, signal AF is a logic low, and signal *AF is a logic high. The logic high condition is the deselect condition so that the voltage range of signal AI for which both signals *AF and *AF are a logic high is the dc margin. Thus, as signal AI is switching from the logic low state, for there to be dc margin, signal AF should switch to a logic high at a voltage of signal AI at which signal *AF is also a logic high. This is achieved by the switch point of the NOR gate 62 and inverter 63 being selected so that the voltage on node 87 is greater than that of node 86 for the case in which signal AI begins as a logic low. The output of inverter 65 will then provide a voltage recognizable as a logic low by NAND gate 77 for a voltage of signal AI which produces a voltage on the output of inverter 64 which remains recognizable as a logic low by NAND gate 76. Thus, nodes 86 and 87 cause both NAND gates 76 and 77 to provide a logic high output for a particular voltage range of signal AI.

For the case in which signal AI is initially at a logic high, nodes 86 and 87 are at a logic high which causes signal *AF to be a logic low and signal AF to be a logic high. In this case then it is desirable for signal *AF to switch to a logic high at a voltage of signal AI which will still cause the input to NAND gate 77 to be recognized as a logic low so that signal AF will be a logic high. As signal AI begins dropping in voltage, the voltage at node 86 will drop more than the voltage at node 87 because the switch point between signal AI and node 87 is lower than the switch point between signal AI and node 86. Thus there will be a voltage of signal AI at which node 86 will be at a sufficiently low voltage to cause transistor 72 to become conductive but node 87 will be of sufficiently high voltage to maintain transistor 74 in a non-conductive state. As transistor 72 becomes conductive, the feedback effect becomes operative to drive node 86 to a lower voltage without any additional drop in voltage of signal AI. This drop in voltage of node 86 is recognized as a logic low by NAND gate 76 so signal *AF is switched to a logic high. Thus there is a voltage range of signal AI for which both signals *AF and AF are at a logic high for the case in which signal AI begins as a logic high. There is then provided both dc margin and hysteresis for buffer 60 for both the logic high to logic low transistion and the logic low to logic high transition. The amount of dc margin and hysteresis desired is selectable using well known techniques.

Figure 4:
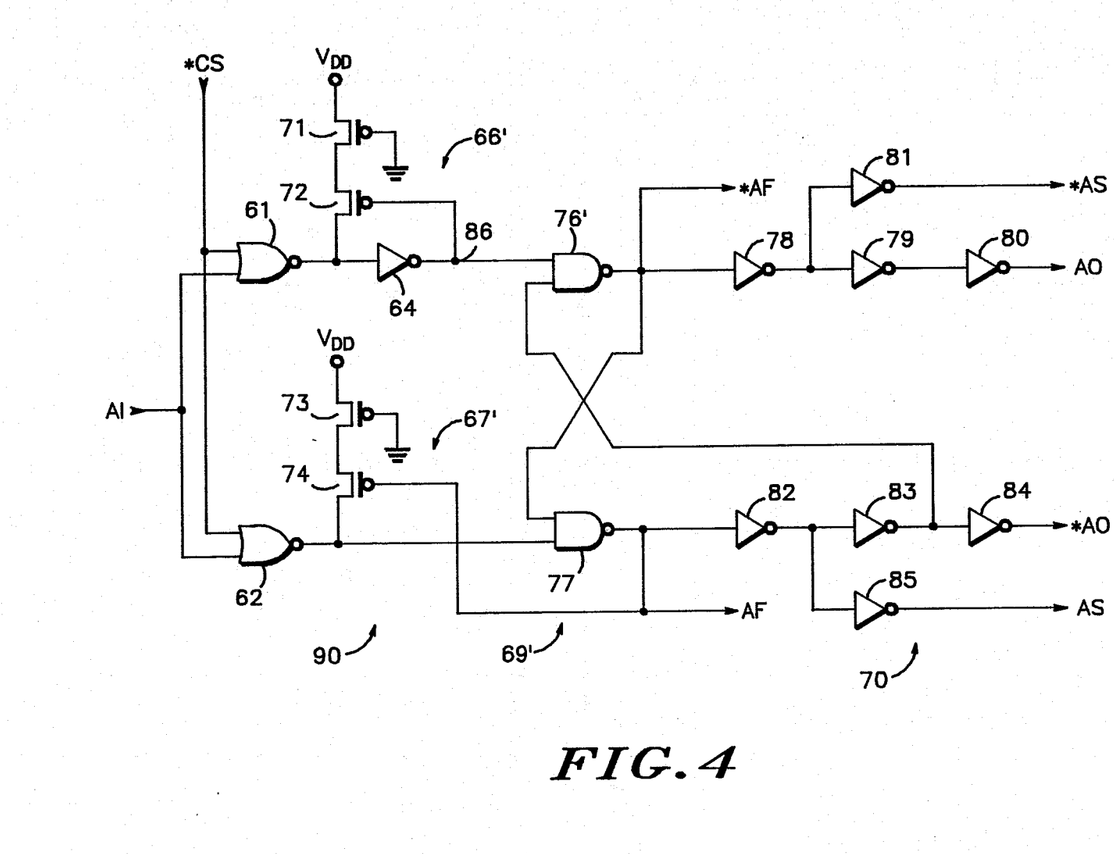
FIG. 4 is a combination logic and circuit diagram of an address buffer according to a second embodiment of the invention for use in the memory of FIG. 1.

Buffer 60 offers a general solution by which there is established two independent paths each having an independent hysteresis circuit. Shown in FIG. 4 is a buffer 90 which uses the same approach but offers some advantages. Buffer 90 has most of the same elements as that of buffer 60. The same elements have the same numbers. The differences are that inverters 63 and 65 are eliminated, an input connection of cross-coupled latch 69 is different, and hysteresis circuit 67 is connected differently. Buffer circuit 90 has a hysteresis circuit 67' which is analogous to hysteresis circuit 67. Hysteresis circuit 67' has an input connected to the output of NAND gate 77, and an output connected to the first input of NAND gate 77. Buffer 90 has a NAND gate 76' which is analogous to NAND gate 76. NAND gate 76' has a first input connected to the output of inverter 64, a second input connected to the output of inverter 85, and an output for providing signal *AF. With elimination of inverters 63 and 65, the output of *OR gate 62 is connected to the first input of NAND gate 77. Latch 69' which is analogous to latch 69 can be considered to include inverters 82 and 83. Inverters 82 and 83 are thus part of output stage 70 and latch 69'.

Having the input of hysteresis circuit 67' connected to the output of NAND gate 77 allows for simplifying buffer 90 over buffer 60. The connection of the second input of NAND gate 77 to the output of inverter 83 has the effect of extending the pulse length of pulses generated by transition circuit 21 for the logic low to logic high transition of signal AI. This effect is for normal operation in which signal AI makes a rapid transition so that the pulse width is determined by the delay time between the the slow and fast signals. The pulse width for a logic low to logic high transition is determined by the time difference between signal AF switching to a logic high and signal *AS switching to a logic low. Signal *AS switches two inverter delays more slowly than if the second input of NAND gate were connected to the output of NAND gate 77. The pulse width defines the time duration for performing various precharging and equalizing actions. The pulse width needs to be long enough to be effective but increasing its length generally increases access time. In the present case the pulse width extension does not increase overall access time because the logic high to logic low transition of signal AI is inherently slower than for the logic low to logic high transition. This inherent delay is caused partly by the presence of inverter 64 between NOR gate 61 and NAND gate 76'. This inherent delay is greater still in the special case in which AI represents a TTL signal. It is well known that this type of inherent delay for a MOS input circuit is greater when the received signal is a TTL signal. An inverter such as inverter 64 is not required between NOR gate 62 and NAND gate 77. Thus, the access time specification is limited by the logic high to logic low transition of signal AI anyway so that the precharge and equalization margin is improved while not adversely effecting the specified access time.

Both buffers 60 and 90 provide for independent signal paths to which hysteresis is independently applied. Because of the need for complementary signals, one of the signal paths must have one more inversion than the other. In the case of buffers 60 and 90 this can be viewed as having the cross-coupled latches 69 and 69' include inverter 64 as part of the cross-coupled latch. This then makes the cross-coupled latches have an inverting and a non-inverting input. Inverters 63 and 65 could also be considered part of latch 69 in which case the input to inverter 63 would be the non-inverting input. Having separate signal paths to which hysteresis is applied allows for selection of the amount of desired dc margin. That the separate paths are developed at the first inverting stage is also advantageous. In a single inverter was used to receive signal AI and then two signal paths developed there would be reduced dc margin with respect to signal AI because of the gain of the first inverter.

Thus, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

We claim:

1. An input buffer circuit for providing true and complementary signals in response to an input signal switching between first and second voltages, comprising:
   a first buffer having an input for receiving the input signal and, an output for providing a first intermediate signal responsive thereto;
   a second buffer having an input for receiving the input signal and, an output for providing a second intermediate signal responsive thereto;
   a cross-coupled latch having an inverting input coupled to the output of the first buffer, a non-inverting input coupled to the output of the second buffer, a first output for providing the true signal, and a second output for providing the complementary signal;
   a first hysteresis circuit coupled to the output of the first buffer for causing the first buffer to provide the first intermediate signal at a voltage which, for a first predetermined range of voltage of the input signal between the first and second voltages, is different for a transition of the input signal from the first voltage to the second voltage than for a transition of the input signal from the second voltage to the first voltage; and a second hysteresis circuit coupled to the output of the second buffer for causing the second buffer to provide the second intermediate signal at a voltage which, for a second predetermined range of voltage of the input signal between the first and second voltages, is different for a transition of the input signal from the first voltage to the second voltage than for a transition of the input signal from the second voltage to the first voltage.

2. The input buffer circuit of claim 1 further comprising an output stage having a first input for receiving the true signal, a second input for receiving the complementary signal, a first output for providing a first buffered signal, and a second output for providing a second buffered signal.

3. The input buffer circuit of claim 2 wherein the output stage comprises:
a first inverter having an input for receiving the true signal, and an output;
a second inverter having an input coupled to the output of the first inverter, and an output for providing the first buffered signal;
a third inverter having an input for receiving the complementary signal, and an output; and
a fourth inverter having an input coupled to the output of the third inverter, and an output for providing the second buffered signal.

4. The input buffer circuit of claim 3 wherein the cross-coupled latch comprises:
a fifth inverter having an input coupled to the output of the first buffer, and an output;
a first NAND gate having a first input coupled to the output of the fifth inverter, a second input coupled to the output of the second inverter, and an output coupled to the input of the third inverter; and
a second NAND gate having a first input coupled to the output of the second buffer, a second input coupled to the output of the first NAND gate, and an output coupled to the input of the first inverter.

5. The input buffer circuit of claim 4, wherein the first hysteresis means comprises a first transistor having a first current electrode coupled to the output of the second buffer, a control electrode coupled to the output of the second *AND gate, and a second current electrode coupled to a first power supply terminal.

6. The input buffer circuit of claim 5, wherein the second hysteresis means comprises a second transistor having a first current electrode coupled to the output of the first buffer, a control electrode coupled to the output of the fifth inverter, and a second current electrode coupled to the first power supply terminal.

7. The input buffer of claim 6, wherein the first buffer is a clocked inverter which is enabled by a control signal.

8. A memory, comprising:
a plurality of memory cells located at intersections of word lines and bit lines;
a row decoder, coupled to the word lines, for enabling a selected word line as determined by a row address comprised of a plurality of row address signals at first or second logic states;
equalization means, coupled to the bit lines, for equalizing the voltages on the bit lines in response to receiving an equalization signal;
a first buffer having an input for receiving the input signal and, an output for providing a first intermediate signal responsive thereto;
a second buffer having an input for receiving the input signal and, an output for providing a second intermediate signal responsive thereto;
a cross-coupled latch having a first input coupled to the output of the first buffer, a second input coupled to the output of the second buffer, and first and second outputs for providing complementary signals;
a first hysteresis circuit coupled to the output of the first buffer for causing the first buffer to provide the first intermediate signal at a voltage which, for a first predetermined range of voltage of the input signal between the first and second voltages, is different for a transition of the input signal from the first voltage to the second voltage than for a transition of the input signal from the second voltage to the first voltage; and
a second hysteresis circuit coupled to the output of the second buffer for causing the second buffer to provide the second intermediate signal at a voltage which, for a second predetermined range of voltage of the input signal between the first and second voltages, is different for a transition of the input signal from the first voltage to the second voltage than for a transition of the input signal from the second voltage to the first voltage.
transition detection means, coupled to the first and second outputs of the cross-coupled latch, for initiating the equalization pulse in response to a transition from the first logic state to the second logic state of one of the complementary outputs.

9. The memory of claim 8 wherein the cross-coupled latch comprises:
a first inverter having an input coupled to the output of the first buffer;
a first NAND gate having a first input coupled to the output of the first inverter, a second input, and an output for providing a first of the complementary outputs; and
a second NAND gate having a first input coupled to the output of the second buffer, a second input coupled to the output of the first NAND gate, and an output connected to the second input of the first NAND gate for providing a second of the complementary outputs.

10. The memory of claim 9 wherein the first buffer is a clocked inverter which is enabled by a chip select signal.

11. The memory of claim 10 wherein the clocked inverter is a NOR gate having a first input for receiving the first address signal, a second input for receiving the chip select signal, and an output coupled to the input of the cross-coupled latch.

12. In an integrated circuit for receiving an input signal externally from said integrated circuit and for providing internal to said integrated circuit a true signal and a complementary signal representation of said input signal, an input buffer comprising:
a first inverter having an input for directly receiving said input signal, and an output for providing a first intermediate signal;

a second inverter having an input for directly receiving said input signal, and an output for providing a second intermediate signal;

a third inverter having an input coupled to the output of the first inverter, and an output for providing the true signal representation of the input signal;

a fourth inverter having an input coupled to the output of the second inverter, and an output;

a first transistor having a control electrode coupled to the output of the third inverter, a first current electrode coupled to the input of the third inverter, and a second current electrode coupled to a first power supply terminal; and a second transistor having a control electrode coupled to the output of the fourth inverter, a first current electrode coupled to the input of the fourth inverter, and a second current electrode coupled to a first power supply terminal; and a fifth inverter having an input coupled to the output of the fourth inverter, and an output for providing the complementary signal representation of the input signal.

* * * * *

UNITED STATES PATENT AND TRADEMARK OFFICE
CERTIFICATE OF CORRECTION

PATENT NO. : 4,807,198

DATED : February 21, 1989

INVENTOR(S) : Stephen T. Flannagan and Peter H. Voss

It is certified that error appears in the above-identified patent and that said Letters Patent is hereby corrected as shown below:

Column 13, line 51, change "*AND" to --NAND--.

Signed and Sealed this

Nineteenth Day of September, 1989

Attest:

DONALD J. QUIGG

Attesting Officer

Commissioner of Patents and Trademarks